US006784496B1

(12) United States Patent
Brodsky et al.

(10) Patent No.: US 6,784,496 B1
(45) Date of Patent: Aug. 31, 2004

(54) CIRCUIT AND METHOD FOR AN INTEGRATED CHARGED DEVICE MODEL CLAMP

(75) Inventors: Jonathan Brodsky, Richardson, TX (US); Robert Steinhoff, Dallas, TX (US); Thomas A. Vrotsos, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 320 days.

(21) Appl. No.: 09/668,999

(22) Filed: Sep. 25, 2000

(51) Int. Cl.[7] .............................................. H01L 23/62
(52) U.S. Cl. ...................................................... 257/355
(58) Field of Search ................................ 257/355, 356, 257/357, 358, 359, 360, 361, 362, 363, 364, 365, 499, 371, 173; 357/234; 361/56; 327/310

(56) References Cited

U.S. PATENT DOCUMENTS

| | | | | |
|---|---|---|---|---|
| 5,134,448 A | * | 7/1992 | Johnsen et al. ............. | 357/234 |
| 5,440,162 A | * | 8/1995 | Worley et al. .............. | 257/355 |
| 5,521,415 A | * | 5/1996 | Kondo ....................... | 257/357 |
| 5,706,156 A | | 1/1998 | Narita ........................ | 361/56 |
| 5,729,419 A | | 3/1998 | Lien ........................... | 361/111 |
| 5,777,368 A | * | 7/1998 | Wu et al. .................... | 257/360 |
| 5,818,087 A | * | 10/1998 | Yee ............................. | 257/355 |
| 5,831,312 A | * | 11/1998 | Wen ............................ | 257/360 |
| 5,847,429 A | * | 12/1998 | Lien et al. .................. | 257/355 |
| 5,869,873 A | * | 2/1999 | Yu ............................... | 257/362 |
| 5,892,262 A | * | 4/1999 | Wu et al. .................... | 257/356 |
| 5,903,420 A | * | 5/1999 | Ham .......................... | 361/56 |
| 5,905,288 A | * | 5/1999 | Ker ............................. | 257/355 |
| 5,945,713 A | * | 8/1999 | Voldman .................... | 257/355 |
| 5,969,929 A | | 10/1999 | Kleveland et al. .......... | 361/111 |
| 5,986,307 A | * | 11/1999 | Yu ............................... | 257/360 |
| 6,011,420 A | * | 1/2000 | Watt et al. ................... | 327/310 |
| 6,081,002 A | * | 6/2000 | Amerasekera et al. ...... | 257/173 |
| 6,114,731 A | * | 9/2000 | London ....................... | 257/355 |
| 6,207,996 B1 | * | 3/2001 | Utsunomiya et al. ....... | 257/356 |
| 6,278,160 B1 | * | 8/2001 | Park et al. ................... | 257/377 |
| 6,281,554 B1 | * | 8/2001 | Pan ............................. | 257/357 |
| 6,326,666 B1 | * | 12/2001 | Bernstein et al. ........... | 257/347 |

FOREIGN PATENT DOCUMENTS

JP          405315552 A    * 11/1993

OTHER PUBLICATIONS

Adel S. Sedra and Kenneth C. Smith, Microelectronic Circuits 1998, Oxford University Press, Fourth Edition, pp. 547–549.*

Ben G. Streetman and Sanjay Banerjee, Solid State Electronic Devices 2000, Prentice Hall, Inc., Fifth Edition, p. 289.*

* cited by examiner

*Primary Examiner*—Wael Fabmyl
*Assistant Examiner*—Dana Farahani
(74) *Attorney, Agent, or Firm*—J. Dennis Moore; W. James Brady, III; Frederick J. Telecky, Jr.

(57) ABSTRACT

A CDM clamp circuit integrated into the interface circuit it is protecting on an integrated circuit. Generally, the integrated CDM clamp circuit and interface circuit are adjacent to each other and share a common device element or component, thus eliminating the need for a metal interconnect. Because there is no interconnect, the parasitic resistance and inductance are also minimized or eliminated from the circuit, thus reducing or eliminating excessive voltage drop. Preferably, the CDM clamp circuit is integrated into the circuit that it is protecting by having the two circuits share the same silicon source region. In a preferred embodiment input circuit, the same diffusion region is the source of both the input transistor and its associated CDM clamp transistor.

18 Claims, 2 Drawing Sheets

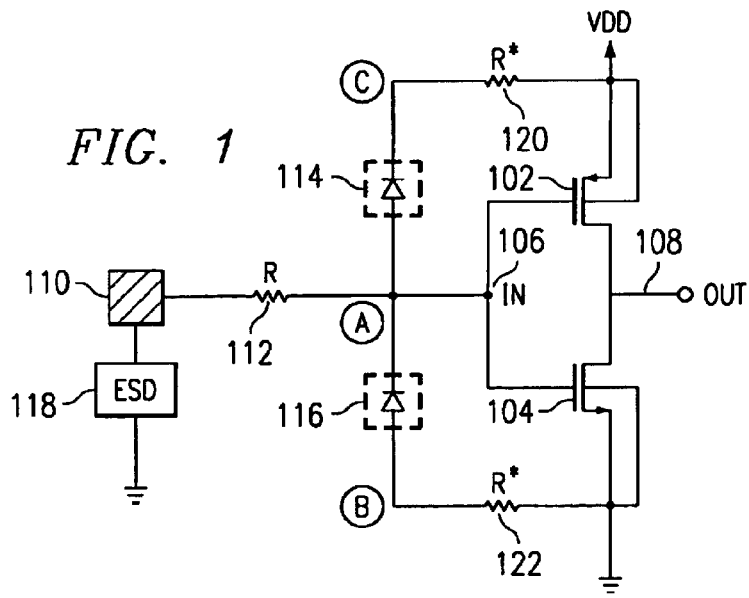
FIG. 1
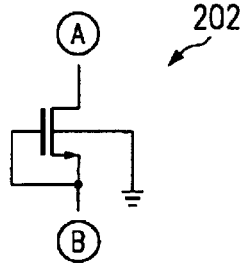
FIG. 2
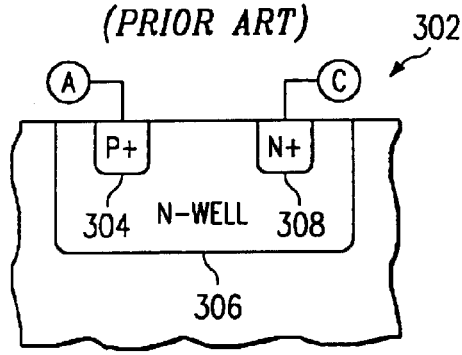
FIG. 3A
(PRIOR ART)
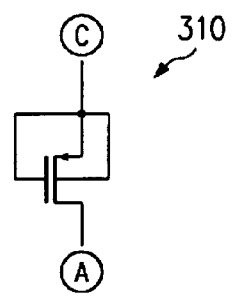
FIG. 3B
FIG. 4A

CIRCUIT AND METHOD FOR AN INTEGRATED CHARGED DEVICE MODEL CLAMP

TECHNICAL FIELD

The present invention relates generally to integrated circuits, and more particularly to a circuit and method for an integrated charged device model clamp.

BACKGROUND

Integrated circuit ("IC") technology continues to improve, resulting in ICs with increasing density and devices with smaller and smaller geometries. As the devices become more miniaturized, however, they generally become more susceptible to electrostatic discharge ("ESD") damage. If ESD is not properly contained, it can lower a device's reliability or even destroy the device.

An ESD event typically occurs when an IC (e.g., a metal oxide semiconductor ("MOS") IC) is handled by a human being or by a machine. During an ESD event, a large voltage is applied to the IC. Generally, to avoid damage to the IC during an ESD event, ESD protection devices are typically fabricated on the IC and connected to the IC input/output pads and input/output circuits and other internal nodes of the IC. As used herein with respect to a component in an IC, the phrase "input/output" means that the component is used for either input or output, or both. ESD protection devices generally provide discharge paths so that the internal circuits of the IC are not damaged during the ESD event.

Different ESD tests may be used to evaluate the effectiveness of ESD protection devices. Three ESD tests typically used include: the human body model ("HBM") test, a machine model ("MM") test and a charged device model ("CDM") test. Different ESD protection devices may be needed to optimize the level of ESD protection provided for the different ESD tests.

A detailed description of CDM events and IC design guidelines is provided in Timothy Maloney, "Designing MOS Inputs and Outputs to Avoid Oxide Failure in the Charged Device Model," EOS/ESD SYMPOSIUM PROCEEDINGS, 1988, pp. 220–27. Generally, a CDM test simulates a charged device contacting a grounded surface (e.g., metal), typically associated with automated handling equipment in the production/manufacturing environment. A CDM test may be performed in the following manner. First, the device to be tested is charged. Most of this charge is stored in the VDD voltage supply rail and/or the ground supply rail within the device. Then one of the pads of the charged device is connected to an external ground. The charges stored in the VDD and/or ground supply rail then find pathways flowing to the pad under test, typically dissipating the charge within nanoseconds, thus testing the ESD protection devices implemented in the IC.

While primary ESD structures (e.g., PDNMOS, BTNMOS, dual-diodes) placed near the input/output pads of a device generally provide protection against HBM and MM events, they do not necessarily provide sufficient protection against CDM events. Generally, the most common damage caused by a CDM event is the rupture of thin dielectrics in the IC, such as MOS gate dielectrics or capacitor dielectrics. CDM clamps, are therefore used to provide protection of internal IC input circuits against charged device ESD events. Generally, in prior art circuits, the CDM clamp devices are separated from the internal input circuit transistors, with a metal interconnect system providing the connections between the CDM clamps and the input circuit.

A disadvantage of the prior art circuits is that the metal/contact/via physical characteristics of this metal interconnect system may significantly increase the parasitic resistance and inductance of the circuit. Generally, in order for CDM clamps to be effective, the parasitic resistance and inductance between the ground/power-supply connections of the internal input circuit and the ground/power-supply connections of the CDM clamps must be minimized. Because the input circuitry may not reside in close physical proximity to its CDM ESD protection structure, however, there may be significant parasitic resistance and inductance in the metal ground bus between the CDM ESD structure and the input circuit inverter/buffer.

Generally, the parasitic inductance and resistance between the ground connection of the CDM clamp and the ground connection of the input circuit act in series with the clamp voltage of the CDM clamp, building up excess voltage across the pin being protected and ground. Likewise, the parasitic inductance and resistance between the power-supply connection of the CDM clamp and the power-supply connection of the input circuit act in series with the clamp voltage of the CDM clamp, building up excess voltage. Because a CDM event may have a peak current level of about 5–10 amps, with a rise time of a few hundred picoseconds, the voltage drop along the ground/power-supply bus metallization may be significant with respect to the CDM clamp voltage. The total voltage drop may be high enough to degrade or rupture the gate oxides of the input transistors.

SUMMARY OF THE INVENTION

These and other problems are generally solved or circumvented, and technical advantages are generally achieved, by preferred embodiments of the present invention in which a CDM clamp circuit is integrated into the interface circuit being protected on the IC. Generally, the integrated CDM clamp circuit and interface circuit are adjacent to each other and share a common device element or component, thus eliminating the need for a metal interconnect. Because there is no interconnect, the parasitic resistance and inductance are also minimized or eliminated from the circuit, thus reducing or eliminating the excessive voltage drop present in prior art circuits.

Preferably, the CDM clamp circuit is integrated into the circuit that it is protecting by having the two circuits share the same silicon source region. In a preferred embodiment input circuit, the same diffusion region is the source of both the input transistor and its associated CDM clamp transistor. In one preferred embodiment, a PMOS input transistor and a PMOS CDM clamp transistor share a single p+ diffusion region. In another preferred embodiment, an NMOS input transistor and a NMOS CDM clamp transistor share a single n+ diffusion region.

An advantage of a preferred embodiment of the present invention is that it generally eliminates the need for a metal interconnect between the sources of the CDM clamp device and the internal circuit device.

Another advantage of a preferred embodiment of the present invention is that, by eliminating the source metal interconnect, it generally minimizes or eliminates parasitic resistance and inductance between the ground/power-supply connection of the internal input circuitry and the ground/power-supply connection of the CDM clamp device.

Another advantage of a preferred embodiment of the present invention is that it reduces the area on the IC needed for CDM protection because the devices are located directly adjacent to each other and because each CDM clamp shares a source region with the transistor that it is protecting.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which:

FIG. 1 is a schematic of an IC input circuit with CDM clamps;

FIG. 2 is a schematic of a transistor implementation of a diode-to-ground CDM clamp;

FIG. 3A is a cross-sectional view of a diode-to-supply CDM clamp;

FIG. 3B is a schematic of a transistor implementation of a diode-to-supply CDM clamp;

FIG. 4A is a schematic of an IC input circuit with MOS transistor CDM clamps;

DETAILED DESCRIPTION

Figure 4B:
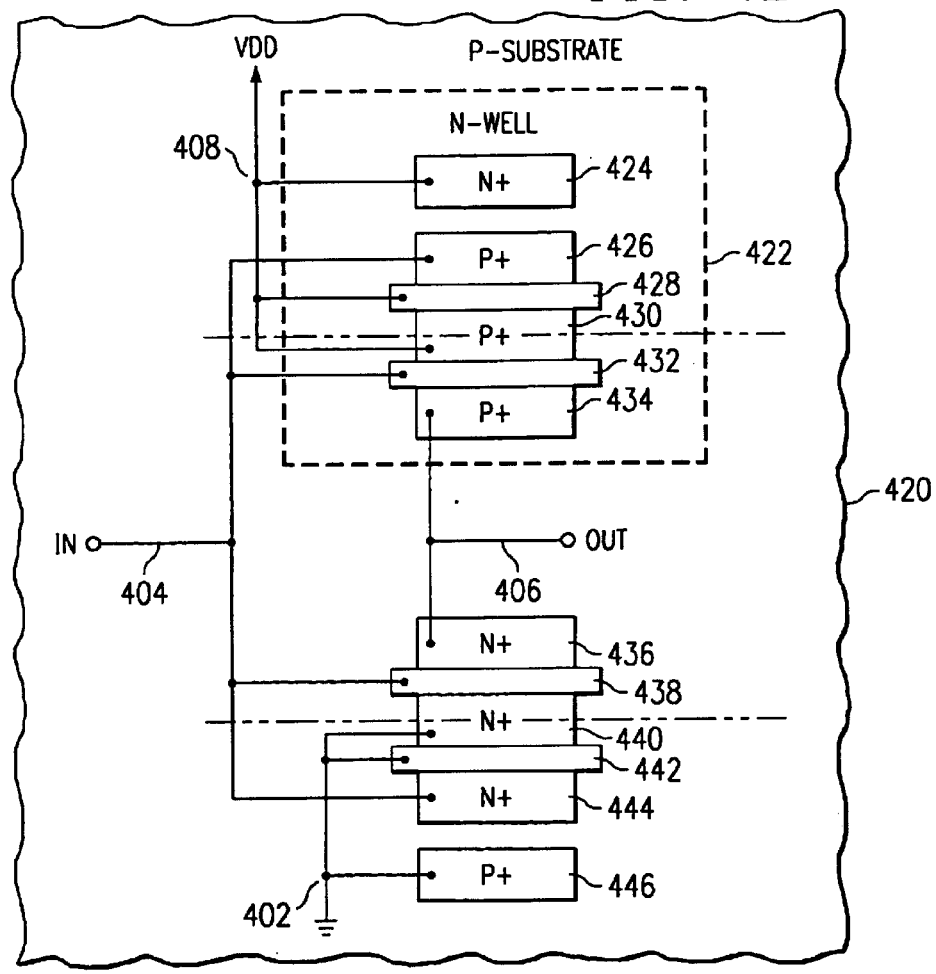
FIG. 4B is a plan view of an IC input circuit with integrated CDM clamps.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an IC input circuit comprising PMOS and NMOS input transistors, with PMOS and NMOS CDM clamp transistors sharing the source diffusion regions of the respective input transistors. Preferred embodiments of the invention may be applied, however, to other integrated ESD and interface circuits. For example, the preferred embodiments may be applied to MOS, CMOS or BiCMOS ICs. Preferred embodiments may be applied to other field effect devices or to advanced bipolar technologies. In addition, preferred embodiments may be used to protect other IC interface circuits connected to the pads of the IC, such as input/output ("I/O") circuits or output circuits.

With reference now to FIG. 1, there is shown a schematic of a CDM protection scheme for an IC MOS input circuit. The input circuit comprises PMOS input transistor 102 and NMOS input transistor 104. Output 108 is connected to other internal IC circuitry. CDM clamp diodes 114 and 116 are connected to input transistors 102 and 104, respectively, to provide protection against CDM events. Input 106 is connected to IC input pad 110 via input resistor 112. Input resistor 112 is chosen so as to limit the current in the CDM clamps, and typically has a value of about 200–400 ohms, although it may be higher or lower than those values.

As shown in FIG. 2, CDM clamp diode 116 between nodes A and B may be implemented as grounded-gate NMOS device 202. As shown in FIG. 3A, CDM clamp diode 114 between nodes A and C may be implemented as a standard PN diode 302 with anode 304 formed by a boron implant in n-type well 306. n+ region 308 provides a contact to n-well 306, which forms the cathode of the diode. Alternatively, CDM clamp diode 114 may be implemented as PMOS device 310 with its gate connected to the power supply voltage.

Referring back to FIG. 1, and as discussed hereinabove, ESD event 118 connects input pad 110 to ground, discharging any charge stored in the VDD and/or ground supply rails of the IC through input pad 110. Preferably, the parasitic resistance between a CDM clamp and its respective input transistor should generally be kept below 0.5 ohms. In the prior art, however, because the CDM clamps and the input transistors are not integrated, metal interconnects are used to connect the devices. These metal interconnects create parasitic resistance and inductance R* 120 and 122 between the CDM clamps and their input transistors, thus interfering with the proper operation of the CDM protection mechanism.

Figure 4C:
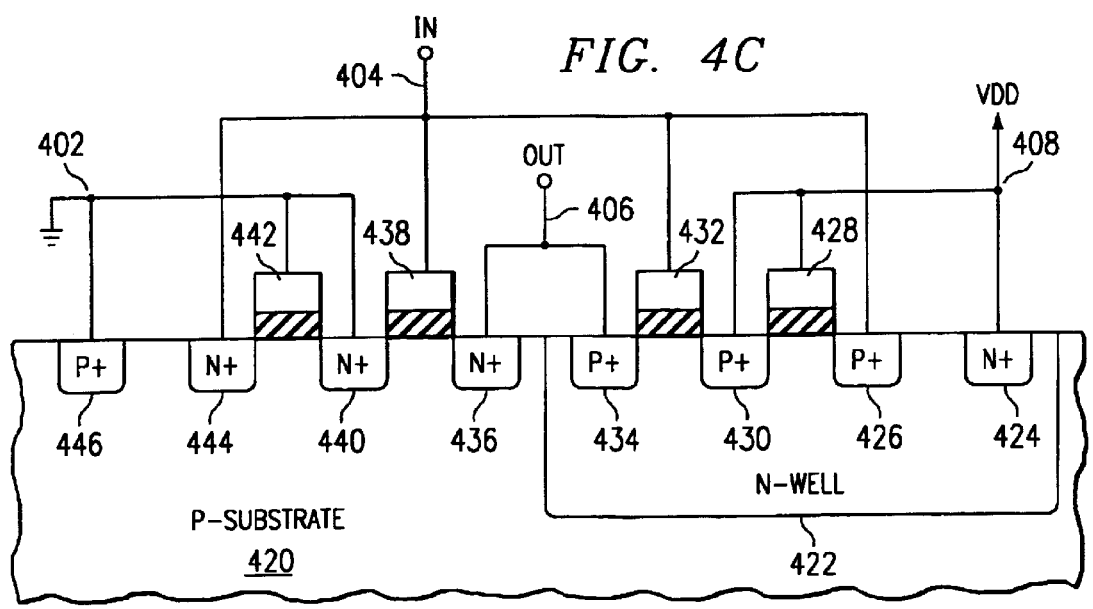
FIG. 4C is a cross-sectional view of an IC input circuit with integrated CDM clamps.

In a preferred embodiment of the present invention, because both of the CDM clamping diodes may be implemented using MOS devices, the CDM clamps may be integrated into the input transistors, as shown in FIG. 4. By integrating the CDM clamps into the same active area as the input transistors of the internal input circuit, the parasitic resistance and inductance are minimized between the ground/power-supply connections of the CDM clamps and the input transistors. FIG. 4A illustrates integrated CDM clamp/input circuit 400 in schematic form. FIG. 4B illustrates a top down view of circuit 400 as implemented in a semiconductor substrate, while FIG. 4C illustrates a cross-section of circuit 400 as implemented in a semiconductor substrate. Note that input resistor 410 in FIG. 4A is not shown in FIGS. 4B and 4C. Ground node 402, input node 404, output node 406 and power supply node 408 are the same in each of the FIGS. 4A, 4B and 4C.

In FIGS. 4B and 4C, the NMOS devices are formed in p-substrate 420, and the PMOS devices are formed in n-well 422. PMOS input transistor 412 in FIG. 4A comprises p+ drain 434, polysilicon gate 432, and p+ source 430 in FIGS. 4B and 4C. NMOS input transistor 414 in FIG. 4A comprises n+ drain 436, polysilicon gate 438, and n+ source 440 in FIGS. 4B and 4C. CDM clamp PMOS transistor 416 in FIG. 4A comprises p+ drain 426, polysilicon gate 428, and p+source 430 in FIGS. 4B and 4C. CDM clamp NMOS transistor 418 in FIG. 4A comprises n+ drain 444, polysilicon gate 442, and n+ source 440 in FIGS. 4B and 4C. Of course, each of the above devices also comprises a gate dielectric and channel underlying the gate. Contact to p-substrate 420 is provided by p+ contact 446, and contact to n-well 422 is provided by n+ contact 424.

As can be seen in FIGS. 4B and 4C, PMOS input transistor 412 and CDM clamp PMOS transistor 416 share p+ source region 430 as a single source for both devices. Similarly, NMOS input transistor 414 and CDM clamp NMOS transistor 418 share n+ source region 440 as a single source for both devices. A metal interconnect layer is not needed to connect the source regions of the devices, thus avoiding the parasitic resistance and inductance created by the metal interconnect of prior art devices.

Although the present invention and its advantages have been described in detail, it should be understood that various changes, substitutions and alterations can be made herein without departing from the spirit and scope of the invention as defined by the appended claims. For example, the specific transistor implementation of the inventive circuits may be varied from the examples provided herein while still remaining within the scope of the present invention. The layout and cross-section representations of the preferred embodiments are generic, and variations of the specific implementations shown are within the scope of the present invention. As other examples, p-type and n-type semiconductor regions may be switched, or the source and drain of a MOS transistor may be switched. Devices may share a different common element other than the source. Integrated circuit materials other than those disclosed herein may be used. As another alternative, multiple transistors or other devices such as diodes may be used for the CDM clamps or input transistors, or combinations may be used. As another alternative, there may be one clamp protecting an internal circuit, or more than two clamps protecting an internal circuit. The CDM clamps may be used in conjunction with other ESD protection devices.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
   an input/output (I/O) pad;
   an interface circuit connected to said I/O pad; and
   a charged device model (CDM) clamp circuit connected to said pad and to said interface circuit, wherein said CDM clamp circuit and said interface circuit are adjacent to each other and share a common device element.

2. The integrated circuit of claim 1, further comprising a resistor disposed between said I/O pad and said interface circuit.

3. The integrated circuit of claim 1 wherein said CDM clamp circuit comprises a first transistor and said interface circuit comprises a second transistor.

4. The integrated circuit of claim 3, wherein said first and second transistors are MOS transistors.

5. The integrated circuit of claim 4, wherein said CDM clamp circuit and said interface circuit share a common source region.

6. The integrated circuit of claim 1, wherein said I/O pad is an input pad and said interface circuit is an input circuit.

7. The integrated circuit of claim 6, wherein said CDM clamp circuit comprises a first PMOS transistor and said interface circuit comprises a second PMOS transistor, and wherein said common device element is a p+ source region.

8. The integrated circuit of claim 6, wherein said CDM clamp circuit comprises a first NMOS transistor and said interface circuit comprises a second NMOS transistor, and wherein said common device element is an n+ source region.

9. The integrated circuit of claim 6, wherein said CDM clamp circuit comprises a first PMOS transistor and a first NMOS transistor, wherein said interface circuit comprises a second PMOS transistor and a second NMOS transistor, wherein said first and second PMOS transistors share a p+ source region, and wherein said first and second NMOS transistors share an n+ source region.

10. A method of protecting an integrated circuit from electrostatic discharge (ESD), said integrated circuit comprising an input/output (I/O) pad and an interface circuit connected to said I/O pad, said method comprising:
    disposing a charged device model (CDM) clamp circuit adjacent to said interface circuit and connected to said pad and to said interface circuit; and
    sharing a common device element between both said CDM clamp circuit and said interface circuit.

11. The method of claim 10, wherein said CDM clamp circuit comprises a first MOS transistor and said interface circuit comprises a second MOS transistor.

12. The method of claim 11, wherein said common device element is a source region.

13. The method of claim 10, wherein said I/O pad is an input pad and said interface circuit is an input circuit.

14. The method of claim 13, wherein said CDM clamp circuit comprises a first PMOS transistor and said interface circuit comprises a second PMOS transistor, and wherein said common device element is a p+ source region.

15. The method of claim 13, wherein said CDM clamp circuit comprises a first NMOS transistor and said interface circuit comprises a second NMOS transistor, and wherein said common device element is an n+ source region.

16. The method of claim 13, wherein said CDM clamp circuit comprises a first PMOS transistor and a first NMOS transistor, wherein said interface circuit comprises a second PMOS transistor and a second NMOS transistor, wherein said first and second PMOS transistors share a p+ source region, and wherein said first and second NMOS transistors share an n+ source region.

17. An integrated circuit comprising:
    a semiconductor substrate;
    a first drain region disposed in said substrate;
    a first channel region disposed in said substrate directly adjacent to said first drain region;
    a first gate dielectric overlying said first channel region;
    a first gate overlying said first gate dielectric;
    a first source region disposed in said substrate directly adjacent to said first channel region;
    a second channel region disposed in said substrate directly adjacent to said first source region and on a side of said first source region opposite to said first channel region;
    a second gate dielectric overlying said second channel region;
    a second gate overlying said second gate dielectric;
    a second drain region disposed in said substrate directly adjacent to said second channel region; and
    an input/output pad electrically coupled to said first gate and to said second drain region.

18. A method of forming an integrated circuit, said method comprising:
    a first drain region in a semiconductor substrate;
    forming a first source region in said substrate separated from said first drain region solely by a first channel region;

forming a second drain region in said substrate separated from said first source region solely by a second channel region, wherein said second channel region is a different region than said first channel region;

forming a first gate dielectric overlying said first channel region and a second gate dielectric overlying said second channel region;

forming a first gate overlying said first gate dielectric and a second gate overlying said second gate dielectric; and forming an input/output pad on said semiconductor substrate electrically coupled to said first gate and to said second drain region.

* * * * *